(12) United States Patent
Ikeda et al.

(10) Patent No.: US 8,506,774 B2
(45) Date of Patent: Aug. 13, 2013

(54) VACUUM PROCESSING DEVICE

(75) Inventors: Jiro Ikeda, Shizuoka (JP); Yoji Takizawa, Ebina (JP)

(73) Assignee: Shibaura Mechatronics Corporation, Yokohama, Kanagawa (JP)

( * ) Notice: Subject to any disclaimer, the term of this patent is extended or adjusted under 35 U.S.C. 154(b) by 609 days.

(21) Appl. No.: 11/596,872

(22) PCT Filed: May 16, 2005

(86) PCT No.: PCT/JP2005/008882
§ 371 (c)(1),
(2), (4) Date: Nov. 17, 2006

(87) PCT Pub. No.: WO2005/111263
PCT Pub. Date: Nov. 24, 2005

(65) Prior Publication Data
US 2008/0029023 A1    Feb. 7, 2008

(30) Foreign Application Priority Data

May 17, 2004   (JP) ................................. 2004-146770

(51) Int. Cl.
*C23C 14/34*     (2006.01)
(52) U.S. Cl.
USPC ................. 204/298.26; 204/298.25; 118/730; 118/500
(58) Field of Classification Search
USPC ................ 204/298.26, 298.25; 118/730, 500
See application file for complete search history.

(56) References Cited

U.S. PATENT DOCUMENTS

| 4,331,526 A | 5/1982 | Kuehnle |
| 4,747,927 A | 5/1988 | Rille et al. |

(Continued)

FOREIGN PATENT DOCUMENTS

| JP | 1500072 | 1/1989 |
| JP | 02-097035 | 4/1990 |

(Continued)

OTHER PUBLICATIONS

JP Patent Application No. 2004-146770, Notifications of Reasons for Rejection, dispatch date Jul. 27, 2010.

(Continued)

*Primary Examiner* — Keith Hendricks
*Assistant Examiner* — Jason M Berman
(74) *Attorney, Agent, or Firm* — Banner & Witcoff, Ltd.

(57) ABSTRACT

To provide a vacuum processing apparatus applicable to various manufacturing processes, by efficiently and highly reliably stacking films of various types and thicknesses and by downsizing the manufacturing apparatus by suppressing size increase of the apparatus due to increase of the number of film forming chambers caused by increase and complexity of process steps. A vacuum processing apparatus is provided with a plurality of film forming process parts which are provided with rotating transfer tables and film forming chambers. The rotating transfer tables form a transfer path for a work to be processed, in chambers which can be vacuum-exhausted. The film forming chambers are provided for depositing a film on the work to be processed which is arranged and transferred along a circumference which has a rotating shaft of the rotating transfer table as a center. The vacuum processing apparatus is also provided with a connecting part which connects the film forming process parts so as to share a vacuum space between the chambers, and the work to be processed in the film forming process parts is mutually transferred in the vacuum. A load lock mechanism is provided in one of the film forming process part or in the connecting part.

11 Claims, 8 Drawing Sheets

(56) References Cited

U.S. PATENT DOCUMENTS

| | | | |
|---|---|---|---|
| 4,874,312 A * | 10/1989 | Hailey | 132/122 |
| 4,886,592 A | 12/1989 | Anderle et al. | |
| 4,917,556 A * | 4/1990 | Stark et al. | 414/217 |
| 4,990,047 A | 2/1991 | Wagner et al. | |
| 5,155,331 A | 10/1992 | Horiuchi et al. | |
| 5,183,547 A | 2/1993 | Ikeda | |
| 5,584,647 A * | 12/1996 | Uehara et al. | 414/744.5 |
| 5,686,026 A | 11/1997 | Ebina | |
| 5,709,785 A | 1/1998 | LeBlanc, III et al. | |
| 5,789,878 A * | 8/1998 | Kroeker et al. | 318/45 |
| 6,159,350 A | 12/2000 | Yoshimura et al. | |
| 6,168,698 B1 * | 1/2001 | Szczyrbowski et al. | 204/298.25 |
| 6,234,788 B1 * | 5/2001 | Lee | 432/124 |
| 6,241,824 B1 | 6/2001 | Bräuer et al. | |
| 6,277,199 B1 | 8/2001 | Lei et al. | |
| 6,602,347 B1 | 8/2003 | Shimoda et al. | |
| 6,602,348 B1 * | 8/2003 | Rogelstad | 118/719 |
| 2003/0194493 A1 * | 10/2003 | Chang et al. | 427/248.1 |
| 2004/0262149 A1 | 12/2004 | Ito et al. | |

FOREIGN PATENT DOCUMENTS

| | | |
|---|---|---|
| JP | 05-271934 | 10/1993 |
| JP | 07188914 | 7/1995 |
| JP | 10107126 A | 4/1998 |
| JP | 10-175186 | 6/1998 |
| JP | 11131230 A | 5/1999 |
| JP | 2000-054131 | 2/2000 |
| JP | 2000-144402 A | 5/2000 |
| JP | 2001226771 A | 8/2001 |
| JP | 2001316816 A | 11/2001 |
| JP | 2003-013223 | 1/2003 |
| TW | 411458 | 11/2000 |
| TW | 556189 | 10/2003 |
| TW | 200306565 | 11/2003 |

OTHER PUBLICATIONS

Office Action in Republic of China Application No. 094115932, Nov. 11, 2010.

US Non Final Office Actions in U.S. Appl. No. 11/579,881, dated May 9, 2012.

US Non Final Office Actions in U.S. Appl. No. 11/579,881, dated Jan. 5, 2010.

US Final Office Actions in U.S. Appl. No. 11/579,881, dated Jul. 8, 2010.

JP Office Action Application No. 2004146416, dated Jul. 13, 2010.

* cited by examiner

FIG. 5

[First film-depositing process part]

Load lock chamber 14a —— to carry a substrate into
    ↓
    First film-depositing chamber (1) 12a — to deposit a first dielectric material film (1)
    ↓
    Cooling chamber 13a
    ↓
    First film-depositing chamber (2) 12b — to deposit a first dielectric material film (2)
    ↓

[Connecting part]

First delivering position 31 — to receive a substrate from the First film-depositing process part
    ↓
    Second delivering position 32 — to deliver a substrate to the Second film-depositing process part
    ↓

[Second film-depositing process part]

Second film-depositing chamber (1) 22a — to deposit a first interfacial layer
    ↓
    Cooling chamber 23a
    ↓
    Second film-depositing chamber (2) 22b — to deposit a recording layer
    ↓
    Cooling chamber 23b
    ↓
    Second film-depositing chamber (3) 22c — to deposit a second interfacial layer
    ↓
    Cooling chamber 23c
    ↓
    Second film-depositing chamber (4) 22d — to deposit a second dielectric material layer
    ↓

[Connecting part]

Second delivering position 32 — to receive a substrate from the Second film-depositing process part
    ↓
    First delivering position 31 — to deliver a substrate to the First film-depositing process part
    ↓

[First film-depositing process part]

First film-depositing chamber (3) 12c — to deposit a thermal buffer layer
    ↓
    Cooling chamber 13b
    ↓
    First film-depositing chamber (4) 12d — to deposit a metallic reflection layer
    ↓
    Load lock chamber 14a — to take out a substrate

VACUUM PROCESSING DEVICE

FIELD OF THE TECHNOLOGY

The present invention relates to a vacuum processing device depositing continuously a multilayer film on a substrate of such an optical disk or an optical component.

DESCRIPTION OF THE BACKGROUND TECHNOLOGY

Optical disks such as the compact disk (CD) or the digital versatile disk (DVD) have been diversified recently, and therefore availability thereof has been still growing from an information medium of reading-only to an optical information medium capable of writing. Synthetic resin, typically polycarbonate, having a low mold shrinkage ratio or a low expansion coefficient is used for substrate materials of the optical disk. Information is recorded on the surface of the substrate as a pit row in the case of the read-only disk, and a guide groove to become the track for laser is formed on the surface of the substrate in the case of the disk capable of writing. A multilayer film containing a writing layer is deposited on the surface to constitute the disk.

FIG. 11 shows an example of a structure of the writable optical disk in which a guide groove 101a guiding a laser beam from an optical head is formed on one surface of a transparent substrate 101 of polycarbonate of 0.6 mm in thickness, then a first dielectric material film layer 102, a phase change writing layer 103, a second dielectric material film layer 104 and a reflection layer 105 are deposited on the surface in this order, and further a UV-cured overcoat layer 106 is coated thereon. The optical disk of approximately 1.2 mm in thickness is obtained by laminating a substrate with films and another substrate 110 of polycarbonate of 0.6 mm in thickness through a lamination adhesive layer 107.

Because quantity of information to be recorded on a disk increases, a structure of the film that enables sure read has been required for densification of recorded information and acceleration of reading speed (Patent Document 1). In order to respond such requirement, it is necessary that the device forming the film should be much more improved on the performance thereof, for example, increasing the number of layers of the multilayer film, or regulating precisely the thickness of the layer.

For example, FIG. 12 shows the layer structure of DVD-RAM type in which a first dielectric material film layer 202, a first interfacial layer 203, a phase change recording layer 204, a second interfacial layer 205, a second dielectric material film layer 206, a thermal buffer layer 207, a reflection layer 208, an overcoat layer 209, an adhesive layer 210 and a substrate 211 of polycarbonate to become a cover are formed by laminating on the surface where a groove 201a of a substrate 201 is formed. Though layers from the first dielectric material layer 202 to the reflection layer 208 of the above-mentioned layers are deposited together in one vacuum processing device, the number of film-depositing chambers in which each layer is deposited must be increased as the number of layers of the multilayer film is increased.

FIG. 13 shows an example of conventional vacuum processing devices for forming a multilayer film. A chamber 120 capable of maintaining in a vacuum state is provided with a load lock mechanism 121, and further first to eighth film-depositing chambers 122a to 122g are arranged in the chamber 120 together with a load lock mechanism 121 so as to be positioned along a circumference at the angular interval of 45 degrees on the circumference. A rotary carrying table 123 having an arm carrying a substrate is disposed at the center of the chamber 120, and rotates intermittently in a horizontal plane about a shaft 124 having an exhaust tube. A disk substrate carried from the load lock mechanism 121 is transported into the first film-depositing chamber 122a, and the film is deposited thereon by sputtering. Then, the substrate is transported into the second film-depositing chamber 122b and other film-depositing chambers in sequence so that a multilayer film can be deposited thereon, thereafter returns to the load lock mechanism 121 and is carried out from the chamber 120. The multilayer film-deposited substrate carried out is coated with the overcoat layer, and laminated with the substrate of polycarbonate of 0.6 mm in thickness through a lamination adhesive layer in order that an optical disk can be obtained. In the above, multilayer film-depositing tact is rate-determined by the film-depositing chamber that requires the most time for film-depositing.

In a general vacuum processing device, a substrate of the object to be processed is carried on the rotary carrying table disposed in the chamber, and is transported to the film-depositing chambers disposed on a circumference with an interval for overlapped film-depositing. Because the number of the film-depositing chambers is increased as the number of layers in the multilayer film increases, the radius of the circumference becomes large. As a result, the dimension of the chamber containing the rotary carrying table is enlarged. Therefore, because the volume to be evacuated increases remarkably, the volume of the exhaust system evacuating to a vacuum state must be increased to the extent beyond necessity, and enlarged. Additionally, carrying circumference for the processed object on the rotary carrying table becomes large, so that the centrifugal force subject to the processed object cannot be neglected when the rotary carrying table is rotated with a high speed to shorten the tact time. Furthermore, intermittent drive control of the rotary carrying table becomes complicated.

Patent Document 1: Japanese Patent Laid-open No. 2001-209974

DISCLOSURE OF THE INVENTION

Problems to be solved by the invention

As to conventional vacuum processing devices, if an attempt to increase the number of film-depositing chambers is made in an device where a series of film-depositing processes are carried out by carrying intermittently with horizontal rotation in an evacuated carrying space, the device must result in a large sized one. In the case that a multilayer film-deposited by a small number of film-depositing is fabricated to cope with various film structures, useless film-depositing chambers would be generated. Though it may be thought that film-depositing is executed with setting a plurality of vacuum processing devices in line, there is a problem that obtaining steadily the quality of products should be difficult because processed objects must be taken out from the vacuum space into the atmosphere while the objects are being processed.

The present invention is intended to obtain a vacuum processing device capable of corresponding to a wide variety of production processes, which can layer efficiently many kinds and thicknesses of films with high reliability and downsize the manufacturing device by suppressing the device become large-sized due to increase of the number of film-depositing chambers according to increase and complication of processing steps.

Means to Solve the Problems

According to an embodiment of the present invention, an aspect of the present invention is a vacuum processing device comprising:

a first film-depositing process part comprising, a first chamber being evacuated in a vacuum state, a first rotary carrying table disposed in the first chamber and having a plurality of susceptors carrying a processed object at a predetermined angular interval so as to form a carrying route for the processed object, and a plurality of film-depositing chambers disposed along a circumference centered at a rotating shaft of the first rotary carrying table in the first chamber and depositing a film in a multilayered form on the processed object to be carried by the rotary carrying table;

a second film-depositing process part comprising, a second chamber being evacuated in a vacuum state, a second rotary carrying table disposed in the second chamber and having a plurality of susceptors carrying a processed object at a predetermined angular interval so as to form a carrying route for the processed object, and at least one film-depositing chamber disposed along a circumference centered at a rotating shaft of the second rotary carrying table in the second chamber and depositing a film on the processed object to be carried by the second rotary carrying table;

a connecting part connecting the first film-depositing process part with the second film-depositing process part, and delivering the processed object processed in the first and the second film-depositing process parts to each other; and a load lock mechanism disposed on any one of the first film-depositing process part, the second film-depositing process part and the connecting part and carrying the processed object in or out of the chamber while maintaining a vacuum state.

Moreover, the number of the first film-depositing chambers can be different from the number of the second film-depositing chambers.

Additionally, a sequence of processing steps can be performed upon connecting the two film-depositing process parts together, or the same processing can be executed in parallel by the two film-depositing process parts in compliance with the number of the film-depositing processing chambers.

Furthermore, the first film-depositing process part and the second film-depositing process part can be provided with a cooling chamber cooling the processed object between respective film-depositing chambers.

Besides, the vacuum processing device is able to include an operation control part to control the device, wherein the load lock mechanism is arranged in the first film-depositing process part, and a film is deposited on the processed object carried from the load lock mechanism into the first chamber arranged in the first film-depositing process part after the object is carried by the first rotary carrying table, the object being transported to the connecting part and then a film being deposited on the object in the second film-depositing chamber after the object being transported thereto by the second rotary carrying table of the second chamber of the second film-depositing process part from the connecting part, the processed object having the films deposited thereon being transported to the first rotary carrying table via the connecting part and a film being deposited thereon in the first film-depositing chamber, thereafter the object being taken out from the load lock mechanism.

The load lock mechanism is arranged in the connecting part and the connecting part contains a delivering mechanism for the processed object capable of doubling as the load lock mechanism.

The connecting part includes positions delivering the processed object to the first film-depositing process part and the second film-depositing process part, and at least one of the delivering positions can double as a cooling chamber. Furthermore, a third film-depositing process part is connected with at least one of the first film-depositing process part and the second film-depositing process part, wherein the third film-depositing process part is comprised of a third chamber capable of being evacuated in a vacuum state, a third rotary carrying table disposed in the third chamber and having a plurality of susceptors carrying a processed object at a predetermined angular interval so as to form a carrying route for the processed object, and a third film-depositing chamber disposed along a circumference centered at a rotating shaft of the rotary carrying table in the third chamber and depositing a film on the processed object to be carried by the rotary carrying table.

Effect of the Invention

The present invention can effectively layer various kinds and thicknesses of films with high reliability. In addition, the present invention can aim to downsize a manufacturing device by suppressing enlargement of the size of the device due to increase of the number of film-depositing chambers caused by increase and complexity of process stages. Thereby, a vacuum processing device capable of responding to various production processes can be obtained.

In the present invention, 'vacuum' means a state that is depressurized to a pressure lower than the atmosphere, and 'vacuum processing' means carrying out a process such as film-depositing by sputtering under a reduced pressure.

PREFERRED EMBODIMENTS TO CARRY OUT THE INVENTION

Referring to the drawings, some embodiments of the present invention will be explained hereinafter. An aspect of the present invention is a vacuum processing device where a plurality of film-depositing process parts having a rotary carrying table and a film-depositing chamber are connected together in a chamber capable of being evacuated in a vacuum state, and a processed object is transported to the film-depositing process parts to form a film thereon in a multilayer with a continuous processing. Detailed explanation thereof will be executed with the embodiments.

Embodiment 1

FIG. 1 to FIG. 3 illustrate an embodiment of the present invention. As shown in FIG. 1, a main chamber 1 capable of being evacuated in a vacuum state forms a guitar-shaped vacuum chamber 4 lengthened shallowly in the horizontal direction with a main body 2 and a top lid member 3. A first film-depositing process part 10 is divided by a first chamber 11 constituting one of the swelled portions, and a second film-depositing process part 20 is divided by a second chamber 21 constituting the other of the swelled portions. The first film-depositing process part 10 and the second film-depositing process part 20 are connected together through the neck portion of the guitar-shape, which defines a connecting part 30 forming the part between the first chamber and the second chamber to be a common vacuum space. Degree of vacuum is preferably matched to the best discharging condition of the film-depositing chamber, e.g. approximately $10^{-1}$ Pa.

In the first film-depositing process part 10, four film-depositing chambers 12a, 12b, 12c and 12d are disposed on a circumference c1 with a predetermined radius r1 centered at the vicinity of the center of the first chamber 11 in such a manner that the centers thereof are positioned on the circumference. Four spaces between respective film-depositing chambers are defined as 'space positions'. A cooling chamber 13a is arranged between the film-depositing chamber 12a and the film-depositing chamber 12b, and a cooling chamber 13b is arranged between the film-depositing chamber 12c and the film-depositing chamber 12d. In addition, a load lock mechanism 14 is disposed between the film-depositing chamber 12d and the film-depositing chamber 12a, and a first delivering position 31 of the connecting part 30 is arranged between the film-depositing chamber 12b and the film-depositing chamber 12c. A load lock chamber 14a of the load lock mechanism and the first delivering position 31 are arranged so that they can be positioned oppositely to each other with respect to the center of the first chamber 11 and on the line dividing the main chamber 1 symmetrically into upper and lower portions in the figure. The load lock chamber 14a can double as a cooling chamber.

As shown in FIG. 2, a first rotary carrying table 15 having a rotating shaft rotating for example in the direction of the arrow is provided at the center of the first chamber 11. The first rotary carrying table 15 is provided with a susceptor 16 in such a manner that the centers of the film-depositing chambers 12, the cooling chambers 13, the load lock mechanism 14 and the delivering position 31 are on the circumference c1 at the angular interval of 45 degrees dividing equally the circumference corresponding thereto into eight divisions. The susceptor 16 carries a substrate 50, which is a processed object including masks 51 and 52, and transports the substrate to each position. The susceptor 16 also acts as a lid member capable of maintaining the film-depositing chamber 12 and the cooling chamber 13 sealed hermetically upon shutting the openings thereof, and is provided with a susceptor base member 16a and a holder 16b carrying the processed object thereon.

The susceptor 16 is mounted on a susceptor-receiving hole 15b disposed along the circumference of a table plate 15a of the first rotary carrying table 15 so as to be movable vertically. To the bottom portion 2 of the chamber corresponding to each position of the first chamber 11, a susceptor push-up mechanism called 'pusher 17' is fixed. When a pusher piston 17a is driven upward as illustrated by the arrow in the figure, the susceptor 16 arrived at this position is pushed up and closes tightly the openings of the film-depositing chamber 12b or the load lock chamber 14a in FIG. 2.

In the case of operation by actual devices, all of eight susceptors including cooling chamber positions are pushed up simultaneously with synchronization by the pushers. With finishing of task, the pushers descend and the susceptors 16 return to the table plate 15a by the aid of a spring 16c. The first rotary carrying table 15 turns intermittently by 45 degrees to move the susceptor 16 to the next position. The pusher 17 is driven again at the next position and processing is carried out.

Evacuation of the first chamber is carried out by an external exhaust pump (not shown) connected to an exhausting passage 15d formed in a rotating shaft 15c of the first rotary carrying table 15.

As shown in FIG. 4, the substrate 50 of the processed object is formed by a disk having a hole at the center thereof of synthetic resin i.e. polycarbonate of 120 mmφ in diameter and 0.6 mm in thickness in the case of DVD, and film-depositing is not carried out in the vicinity of the center and the periphery thereof. Therefore, the disk is transported together with a disk-shaped center mask 51 at the center and a ring-shaped outer mask 52 at the periphery attached thereon and then a film is deposited on the disk. Both the masks are made of magnetic material, and the bottom portion of the center mask is provided with a mechanical stopper 53 inserted in the disk hole to hold the disk. As a result, if the center mask is lifted up by a magnetic chuck, the disk is also lifted up simultaneously.

The film-depositing chamber 12 (12a to 12d) deposits coated films on the transported substrate 50 by sputtering. Sputtering is carried out by a glow discharge generated in the film-depositing chamber upon applying a direct or alternate voltage between the electrode of the target $12_1$ side and the electrode located in the vicinity of the substrate 50 side, in order that a fine target material can be scattered out by impacting the ions generated by the discharge onto the target, and thereby the material is deposited on the substrate 50.

The cooling chamber 13 (13a, 13b) has a structure in which a cooling plate is disposed facing the transported substrate 50 and a coolant gas is introduced to cool the substrate by conducting the heat of the substrate 50 to the cooling plate side. Cooling in the vacuum is very difficult if the substrate 50 is heated and the temperature thereof is raised by the sputtering in the film-depositing chamber of the preceding process. Therefore, upon incorporating a vacuum cooling process between respective film-depositing processes of the continuous vacuum process, film-depositing in the next process can be executed at a desired temperature of the substrate.

The load lock mechanism 14 is a mechanism that transports a substrate located in the atmosphere into a vacuum chamber without breaking its vacuum state. Load lock upper lids 14c1 and 14c2 are disposed on the both ends of a rotatable pick-and-place-arm 14b to transport the substrate alternately between the load lock chamber 14a and an external conveyor. When the load lock upper lid 14c2, which has conveyed a substrate 50 to be processed using an electromagnetic chuck 14d, seals hermetically an outer opening 14a1 of the load lock, the susceptor 16 pushed up by the pusher 17 seals hermetically an inner opening 14a2 of the load lock and receives the substrate 50 with masks simultaneously. When the load lock chamber 14a is evacuated by an attached exhaust system (not shown) and the vacuum level thereof comes to reach the extent of the vacuum level in the first chamber 11, the pusher 17 descends and the load lock chamber 14a is opened to the chamber side. Then a substrate 50 to be processed is loaded on the first rotary carrying table 15.

The processed substrate 50 on which a multilayer film has been deposited in the final film-depositing chamber 12d is transported to the position of the load lock chamber 14a by the first rotary carrying table 15. When the pusher 17 of this position pushes up the susceptor 16 having the substrate 50 loaded thereon and the susceptor 16 is hermetically joined to the inner opening 14a2 of the load lock chamber, the substrate 50 with masks is electromagnetically chucked to the upper lid 14c2 simultaneously. When the load lock chamber 14a is leaked up to the atmospheric pressure by the attached exhaust system on the condition above, the upper lid 14c2 is released and lifted by the arm 14b, and then moved to the position of the conveyor. At the same time, the other upper lid 14c1 carries a new substrate 50 with masks to be processed to the load lock chamber 14a through the outer opening 14a1, and then the load lock chamber is tightly sealed from the atmosphere. Thereafter, the substrate is transported to the first film-depositing chamber 12a in accordance with the processing steps mentioned above.

The second film-depositing process part 20 has the same structure as that of the first film-depositing process part 10 except that the second film-depositing process part 20 does not have a load lock chamber. The second film-depositing process part 20 has a structure in which four film-depositing chambers 22a to 22d and three cooling chambers 23a to 23c are arranged alternately along the circumference of a predetermined radius r2 centered approximately at the central portion of the second chamber 21 formed in the circular swelled portion, and a second delivering position 32 of the connecting part 30 is disposed at the cooling position between the first film-depositing chamber 22a and the fourth film-depositing chamber 22d. A second rotary carrying table 25 (FIG. 3) having a rotating shaft at the center of the chamber is disposed in the chamber, and transports a substrate 50 transported to the delivering position 32 to the film-depositing chambers 22a to 22d. Namely, a disk substrate travels sequentially through the film-depositing chamber 22a, the cooling chamber 23a, the film-depositing chamber 22b, the cooling chamber 23b, the film-depositing chamber 22c, the cooling chamber 23c and the film-depositing chamber 22d for film-depositing. Thereafter, the substrate 50 is again carried to the delivering position 32 and returns to the first delivering position of the first film-depositing process part 10 side through the connecting part 30.

Evacuation of the chamber is carried out by an external exhaust pump (not shown) connected to the exhausting passage formed in the rotating shaft (not shown) of the second rotary carrying table 25 in cooperation with the exhaust system of the first film-depositing process part.

The connecting part 30 connects the vacuum spaces of both chambers 11 and 21 in common by the connecting space of chamber surrounded by a chamber wall 33 continuing from the first chamber 11 and the second chamber 21. The connecting part 30 is provided with the first delivering position 31 on the first film-depositing process part 10 side, the second delivering position 32 on the second film-depositing process part 20 side, and a delivering mechanism 34 (FIG. 3) between the two positions. The delivering mechanism 34 is constituted of a pick-and-place-arm 36 having a rotating shaft 35 at the center thereof and an electromagnetic chuck 37 provided on the both ends thereof. The arm 36 is rotated and controlled by a motor 38 connected with the rotating shaft. The electromagnetic chuck 37 is comprised of a part $37_1$ for the center mask and a part $37_2$ for the outer mask. The position of the center mask is on a circumference c3, which is in contact with the circumferences c1 and c2 of the first and second rotary tables 15 and 25.

Upon driving the pusher $17_1$ located on the delivering position 31 of the first chamber 11 side, a substrate $50_1$ with masks is adsorbed by the electromagnetic chuck 37A of the first rotary carrying table 15 side. The pusher $17_2$ on the second delivering position 32 of the second chamber 21 side is operated in the same time. A susceptor 26 of the second chamber 21 side is then pushed up and a substrate $50_2$ with masks is adsorbed by another electromagnetic chuck 37B. When both the substrates are adsorbed to the arm 36 side, both the pushers retract downward and respective susceptors return to the first rotary carrying table 15. Next, the arm 36 turns by 180 degrees and exchanges with each other the positions on which the substrates $50_1$ and $50_2$ are located respectively. The pushers $17_1$ and $17_2$ are again operated and push up each susceptor so as to come into contact with the substrates exchanged like the above. On the other hand, upon stopping operation of the electromagnetic chuck 37, respective substrates are placed on each susceptor. By repeating the operation mentioned above, exchange of substrates between both chambers can be continuously carried out in a vacuum with ease.

As mentioned above, the vacuum processing device of this embodiment has a structure in which the first film-depositing process part 10 constituted of four film-depositing chambers, two cooling chambers and one load lock chamber, and the second film-depositing process part 20 constituted of four film-depositing chambers and three cooling chambers, both the process parts being connected together through the connecting part as a common vacuum space.

By carrying out continuously multilayered film-depositing with two film-depositing process parts, the whole device can be made compact. If film-depositing positions or cooling positions in the continuous vacuum film-depositing using a rotary carrying table are increased, the radius of the rotary carrying table increases proportionally in compliance with the number of the positions, so that the volume of the chamber increases by about the second power thereof. In this embodiment, upon merely increasing the space of the connecting part a little, the vacuum space can be confined to the minimum, and exhausting efficiency can be ameliorated. Furthermore the diameter of the rotary carrying table becomes small and control of the driving motor can be easily executed. Quick intermittent rotation can be also realized.

In the case of fabricating optical disks having a multilayer film shown in FIG. 12, operation of the device according to this embodiment will be explained referring to FIG. 5.

The multilayer film has seven layers and the first dielectric material film 202 is an insulating material such as ZnS—$SiO_2$ and must be thicker than other layers, so that film-depositing is carried out by means of two film-depositing chambers for sharing the processes. Shared film-depositing can make the tact shorten.

Respective film-depositing process parts and the connecting part of the vacuum processing device are controlled together by the operation control part 60.

(1) The First Film-Depositing Process Part 10

1-1 The load lock mechanism 14—to transport a substrate 201 molded by a stamper machine into the load lock chamber 14a after attaching a mask thereto.

1-2 The first film-depositing chamber (1) 12a—to form a part of the first dielectric material film layer 202 by sputtering on the transported substrate.

1-3 The cooling chamber 13a—to cool the substrate taken out from the first film-depositing chamber (1) 12a.

1-4 The first film-depositing chamber (2) 12b—to form the remaining part of the first dielectric material film layer 202 by sputtering on the transported substrate.

1-5 To transport the substrate having the first dielectric material film layer 202 deposited thereon to the first delivering position 31.

1-6 To transport a multilayer substrate having the second dielectric material film layer 206 deposited thereon in the second film-depositing chamber (4) 22d to the first film-depositing chamber (3) 12c at the first delivering position.

1-7 The first film-depositing chamber (3) 12c—to form a thermal buffer layer 207 on the transported substrate by sputtering.

1-8 The cooling chamber 13b—to cool the substrate taken out from the first film-depositing chamber (3) 12c.

1-9 The first film-depositing chamber (4) 12d—to form a metallic reflection layer 208 on the transported substrate by sputtering.

1-10 To carry the substrate taken out from the first film-depositing chamber (4) 12d to the load lock chamber 14a.

1-11 To take out the substrate having a multilayer film-deposited thereon from the load lock chamber 14a.

(2) The Connecting Part 30

2-1 To transfer the substrate transported to the first delivering position 31 onto the second delivering position 32.

2-2 To transfer simultaneously the substrate transported to the second delivering position 32 onto the first delivering position 31.

(3) The Second Film-Depositing Process Part 20

3-1 To transport the substrate carried in the second delivering position 32 to the second film-depositing chamber (1) 22a.

3-2 The second film-depositing chamber (1) 22a—to form a first interfacial layer 203 on the transported substrate by sputtering.

3-3 The cooling chamber 23a—to cool the substrate taken out from the second film-depositing chamber (1) 22a.

3-4 The second film-depositing chamber (2) 22b—to form a recording layer 204 on the transported substrate by sputtering.

3-5 The cooling chamber 23b—to cool the substrate taken out from the second film-depositing chamber (2) 22b.

3-6 The second film-depositing chamber (3) 22c—to form a second interfacial layer 205 on the transported substrate by sputtering.

3-7 The cooling chamber 23c—to cool the substrate taken out from the second film-depositing chamber (3) 22c.

3-8 The second film-depositing chamber (4) 22d—to form a second dielectric material film layer 206 on the transported substrate by sputtering.

3-9 To transport the film-deposited substrate to the second delivering position 32.

In the fabrication process of a substrate, the steps from 1-6 to 1-11 of the first film-depositing process part 10 correspond to the after process of the process steps of the second film-depositing process part 20.

In this embodiment, the rotating direction of the rotary carrying table of the first film-depositing process part 10 is the same as the rotating direction of the rotary carrying table of the second film-depositing process part 20. However the rotating directions above are free from each other for each film-depositing process part, so that they can be set in accordance with the processed object. In addition, operation of each susceptor can also be controlled individually in order to carry out necessary processing.

Because many steps such as combination of film-depositing chambers and cooling chambers can be installed in a downsized device in accordance with the present invention, multilayer film substrates to be processed by the sheet-fed system can be processed on variety of conditions. Therefore, evenness of the film thickness and uniformity of the film quality are improved, and thereby substrates of multilayer film with high quality can be obtained.

Besides, the structure of this embodiment can cope with variety of changes of the fabrication process.

With respect to fabrication of multilayer films constituted of four layers CD-R shown in FIG. 11, the films can be deposited by operating only the first film-depositing process part 10, or the same film-depositing processes are executed in parallel upon operating the first and the second film-depositing process parts. Moreover, one of the film-depositing process parts can be turned twice in accordance with the type of multilayer film.

As mentioned above, the process can be flexibly changed in compliance with the type of the optical disk, and fabrication can be performed without useless film-depositing chambers.

Embodiment 2

As shown in FIG. 6, arrangement of the first film-depositing process part 10 and the second film-depositing process part 20 of this embodiment is the same as that of the Embodiment 1, but the number of the film-depositing chambers in the second film-depositing process part 20 is three (22a to 22c) different from the Embodiment 1 and the number of the cooling chambers is two (23a, 23b). The remaining parts are the same as the Embodiment 1, so that the same part is denoted by the same mark and explanation thereof will be omitted. Upon decreasing the number of the film-depositing chambers in the second film-depositing process part 20 compared to the first film-depositing process part 10 in accordance with various types of optical disks, the volume of the chamber can be set to be a bare minimum. Downsizing, reducing the installation area and facilitating the control can also be improved. Besides, at least one of the delivering positions 31 and 32 can double as a cooling chamber.

Embodiment 3

As shown in FIG. 7, arrangement of the first film-depositing process part 10 and the second film-depositing process part 20 of this embodiment is the same as that of the Embodiment 1, but the load lock mechanism 14A is located at the position of the cooling chamber 13a in the Embodiment 1 and the cooling chamber 13c is located at the position of the load lock mechanism 14A in the Embodiment 1. The remaining parts are the same as the Embodiment 1, so that the same part is denoted by the same mark and explanation thereof will be omitted. This embodiment can be operated like the Embodiment 1.

Embodiment 4

As shown in FIG. 8, arrangement of the first film-depositing process part 10 and the second film-depositing process part 20 of this embodiment is the same as that of the Embodiment 1, but the load lock mechanism 14B is located at the position of the first film-depositing chamber 12b in the Embodiment 1. Locating the cooling chamber 13c at the position of the load lock chamber 14a in the Embodiment 1 is the same as the Embodiment 3. The remaining parts are the same as the Embodiment 1, so that the same part is denoted by the same mark and explanation thereof will be omitted. This embodiment can be operated like the Embodiment 1.

Embodiment 5

As shown in FIG. 9, this embodiment has a structure in which the load lock mechanism 70 is disposed in the connecting part 30. The same part as that of the Embodiment 1 is denoted by the same mark and explanation thereof will be omitted. The load lock mechanism 70 doubles as delivering function of the substrate between the first film-depositing process part 10 and the second film-depositing process part 20 as well as the primary load lock function, and is constituted of the load lock chamber 71 located in the connecting part and the pick-and-place-arm 72 having three arms extending toward the load lock chamber 71, the first delivering position 31 of the first film-depositing process part 10 side and the second delivering position 32 of the second film-depositing process part 20 side respectively at the angular interval of 120 degrees together.

In the horizontal rotary table system in which the rotary carrying tables of respective film-depositing process parts have rotating shafts in the vertical direction, a processed substrate to be loaded on each susceptor is carried on the condition of top-loading. In consequence, the electromagnetic chucks fitted on each arm of the pick-and-place-arm 72 are attached downward. The substrate having arrived at each delivering position or the load lock chamber is fixed to the top side of the susceptor on the condition of being hung in compliance with vertical movement of the arm, and is delivered to another position upon turning the arm by 120 degrees. The load lock chamber 71 opens in the bottom direction of the chamber and a substrate to be processed is carried in or out from the bottom side. When the pick-and-place-arm 72 is turned in the direction of the arrow of the figure, the film-depositing process starts from the second film-depositing process part 20 and the last-half film-depositing process is carried out in the first film-depositing process part 10 after passing through the connecting part. The substrate, on which the film has been deposited, is again carried to the first delivering position 31, and then moved to the load lock chamber 71 so as to be carried outside. Rotating direction can be arbitrarily selected at each film-depositing process part and the connecting mechanism.

Because the load lock mechanism is disposed between the first and the second film-depositing process parts in this embodiment, independency of the film-depositing process part can be raised and the process step corresponding to the type of optical disks can be easily changed.

Embodiment 6

In this embodiment as shown in FIG. 10, a third film-depositing process part 80 as well as the second film-depositing process part 20 is branched from the first film-depositing process part 10 having the load lock mechanism 14C. The third film-depositing process part 80 contains a rotary carrying table and film-depositing chambers, and is connected with the first film-depositing process part 10 through a connecting part 81. The same part as that of the Embodiment 1 is denoted by the same mark and explanation thereof will be omitted. This example has four first film-depositing chambers (12*a* to 12*d*) in the first film-depositing process part 10, the cooling chamber 13*a*, three second film-depositing chambers (22*a* to 22*c*) in the second film-depositing process part 20, and two third film-depositing chambers (82*a*, 82*b*) in the third film-depositing process part 80. Upon allocating film-depositing process parts in compliance with the sort of multilayer to be layered according to this embodiment, sputtering can be precisely controlled. In addition, it becomes easy to match the tact. Besides, deposition of sputtered material inside the chamber is so restricted that maintenance such as cleaning can be facilitated.

Though the present invention has been explained heretofore using the embodiments mentioned above, it is needless to say that the present invention is not restricted to the embodiments mentioned above and many kinds of variations are possible unless they deviate from the scope of the present invention.

BRIEF DESCRIPTION OF THE DRAWINGS

FIG. 5 is a chart of the process steps explaining operation of the embodiment 1.

EXPLANATION OF THE MARKS

Figure 1:
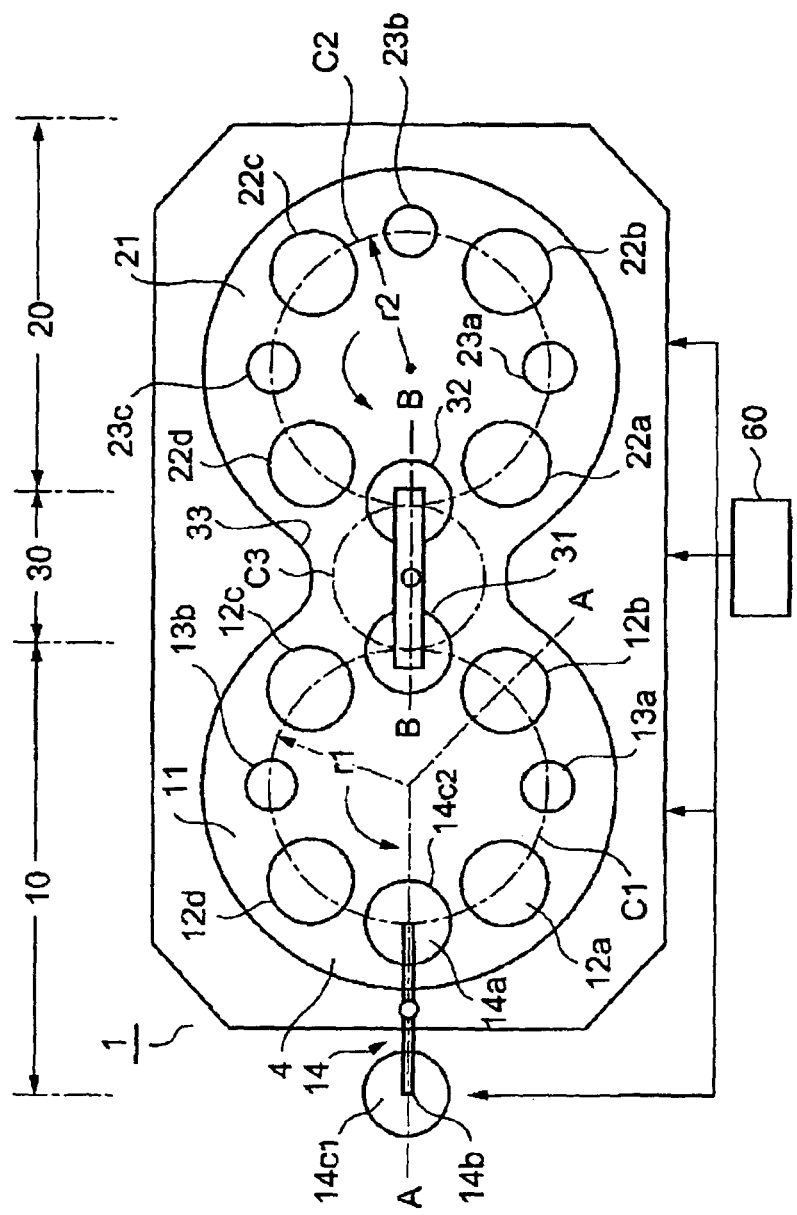
FIG. 1 is a schematic plan view of the embodiment 1.
Figure 2:
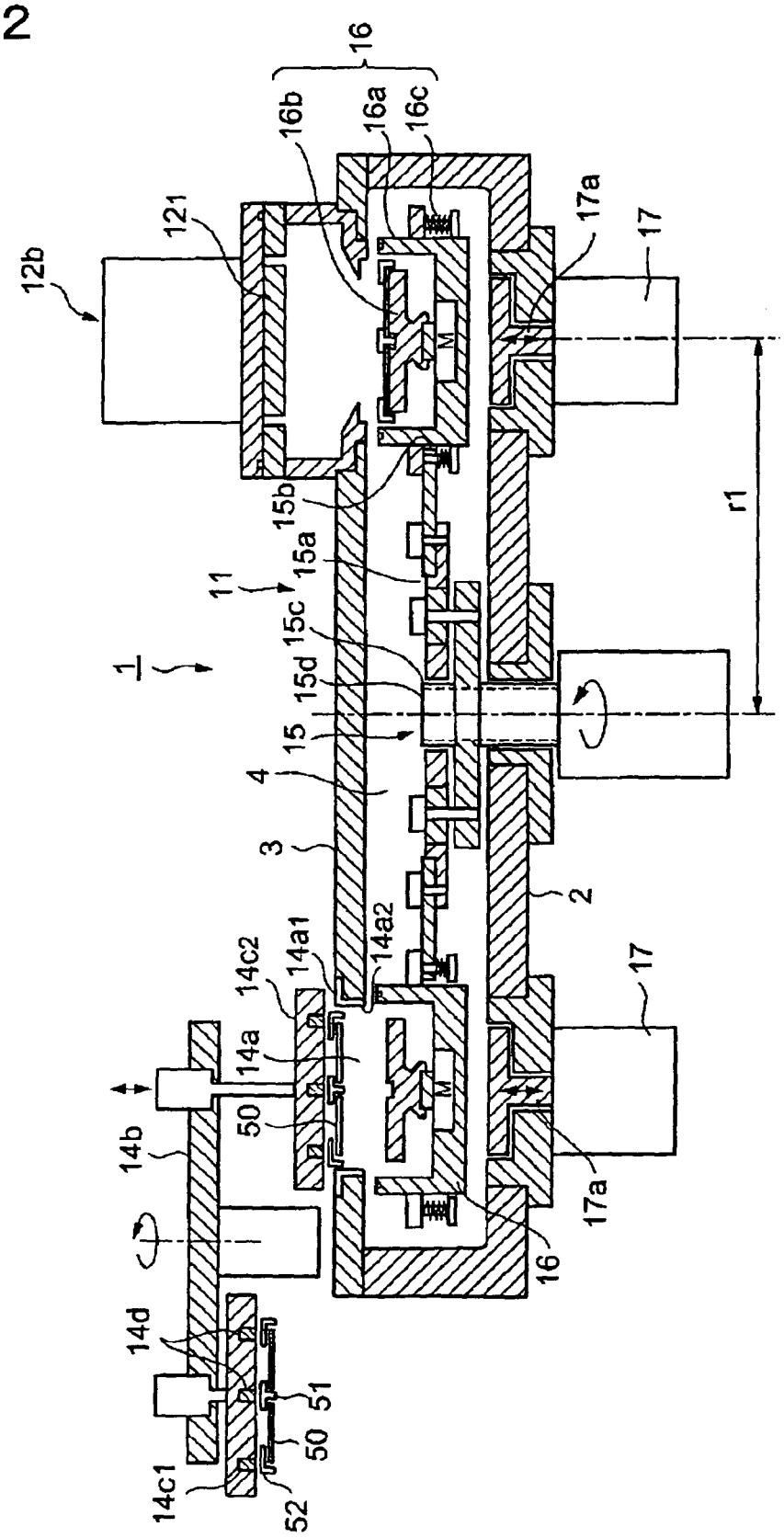
FIG. 2 is a schematic cross sectional view cut along the line A-A of FIG. 1.
Figure 3:
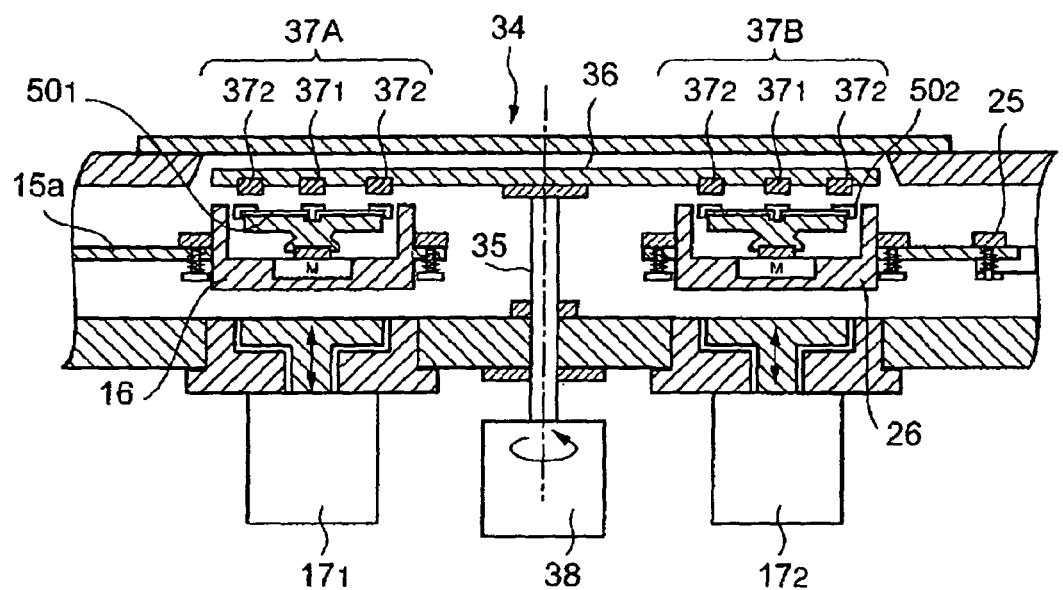
FIG. 3 is a schematic cross sectional view cut along the line B-B of FIG. 1.
Figure 4:
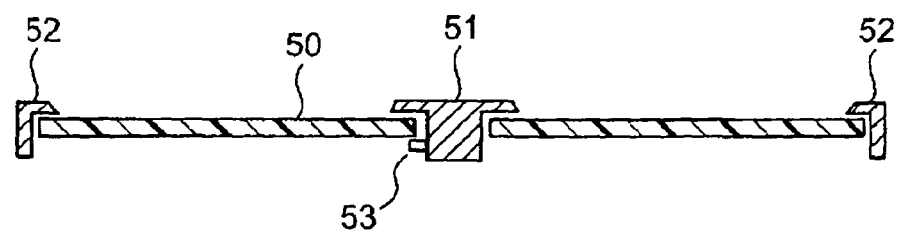
FIG. 4 is a schematic cross sectional view of the substrate equipped with masks.
Figure 6:
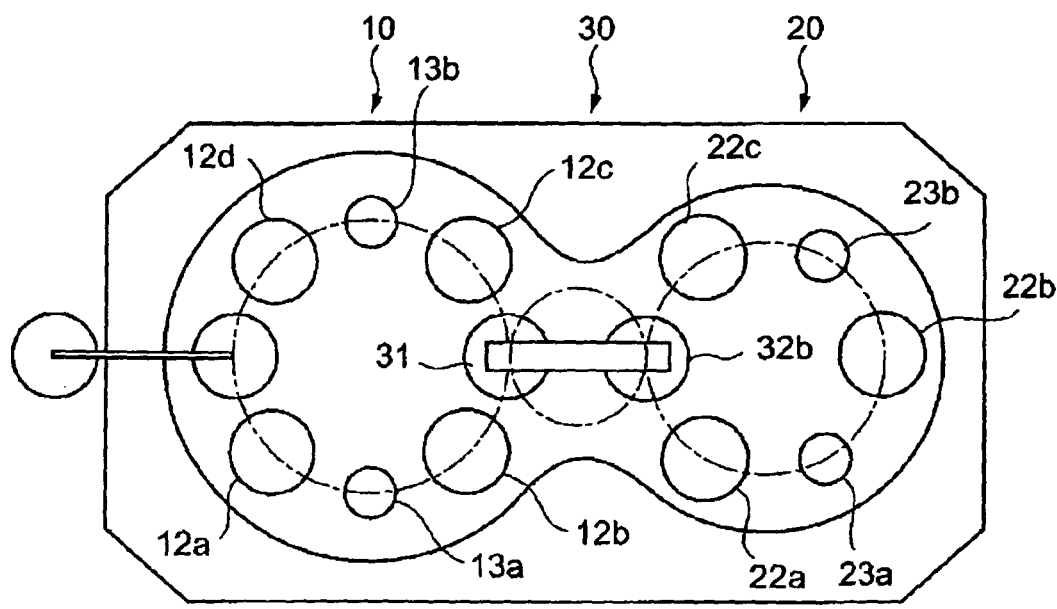
FIG. 6 is a schematic plan view of the embodiment 2.
Figure 7:
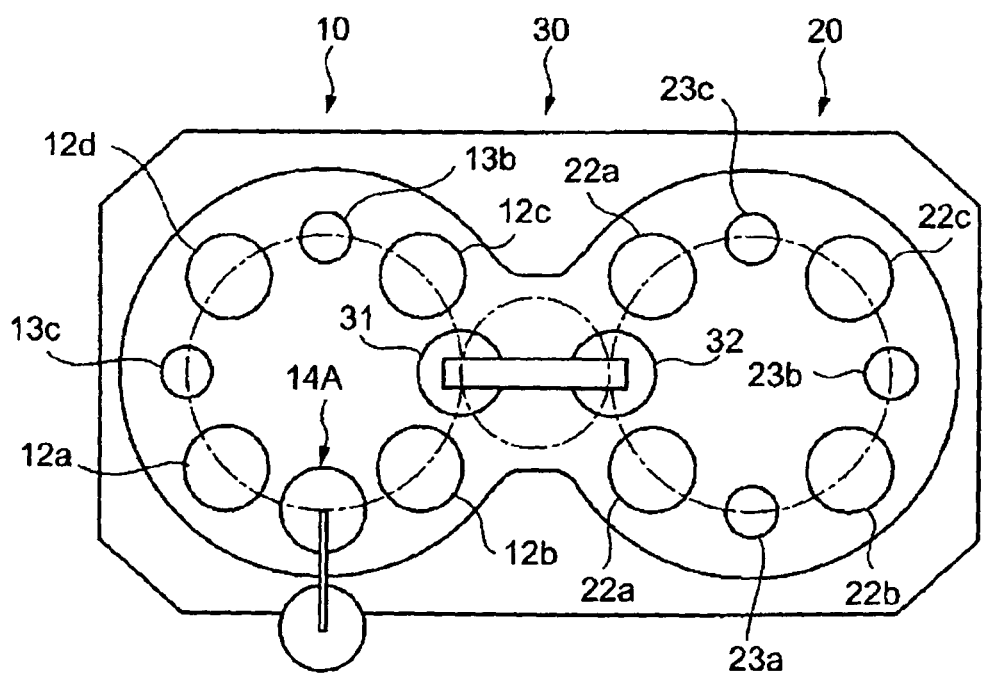
FIG. 7 is a schematic plan view of the embodiment 3.
Figure 8:
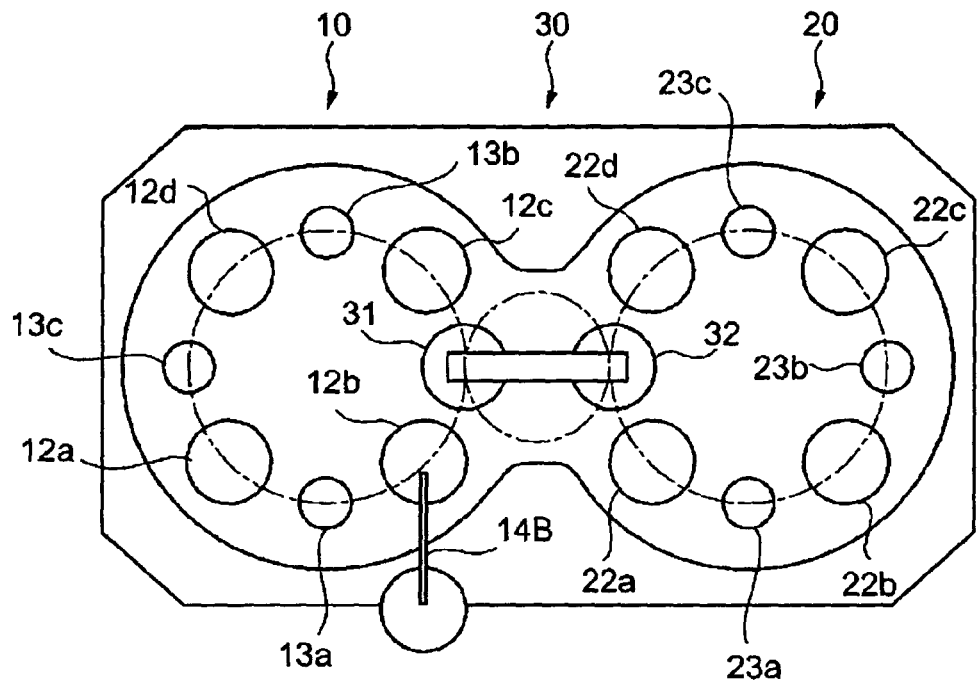
FIG. 8 is a schematic plan view of the embodiment 4.
Figure 9:
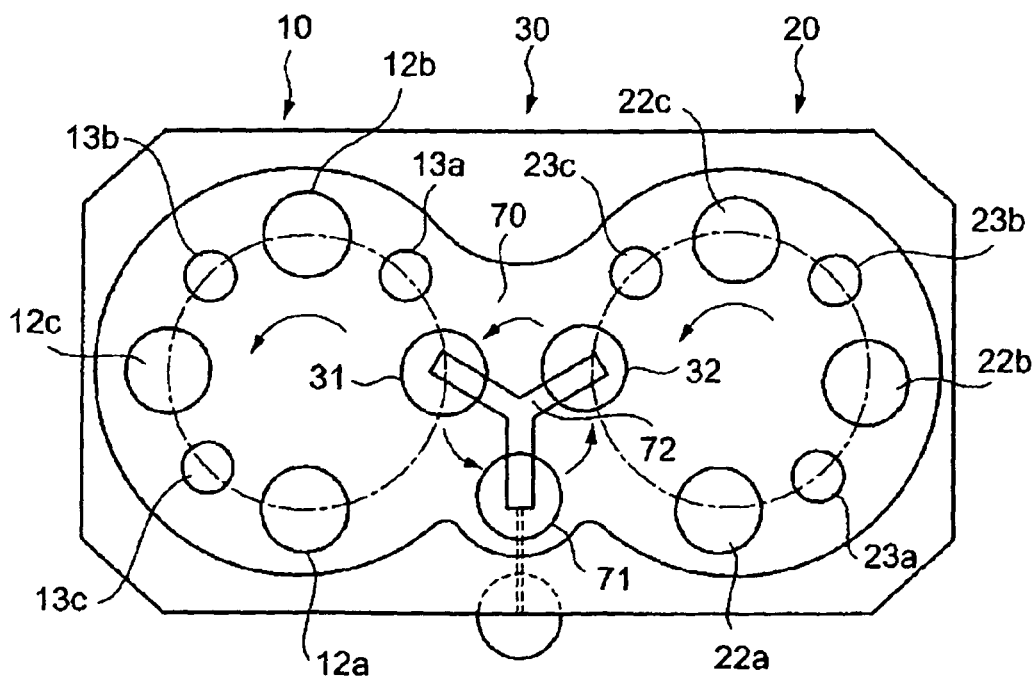
FIG. 9 is a schematic plan view of the embodiment 5.
Figure 10:
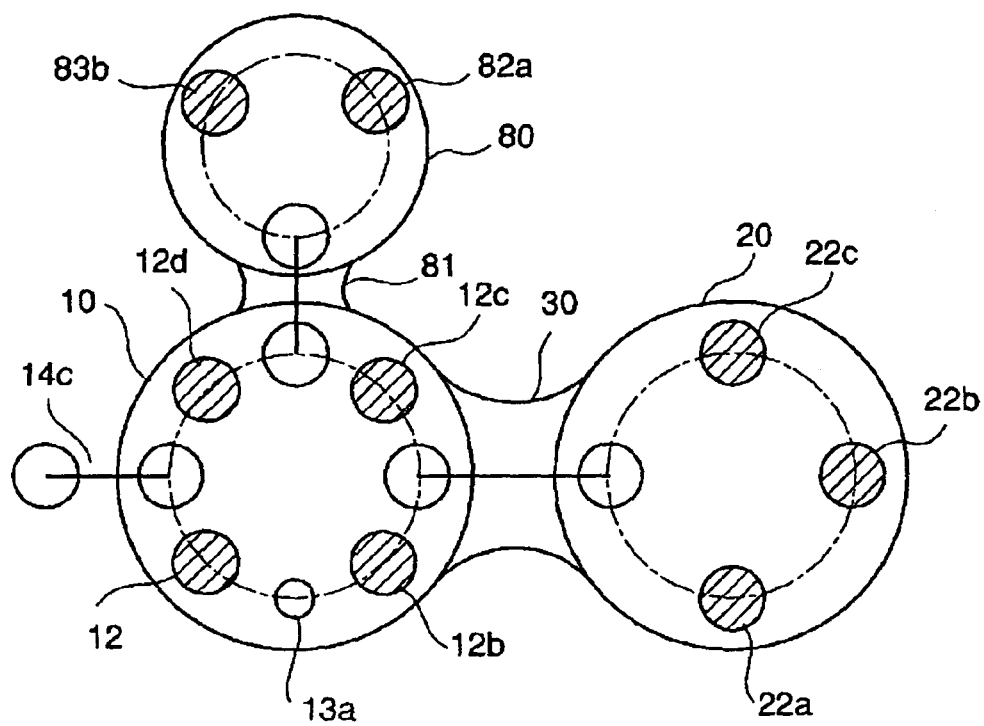
FIG. 10 is a schematic plan view of the embodiment 6.
Figure 11:
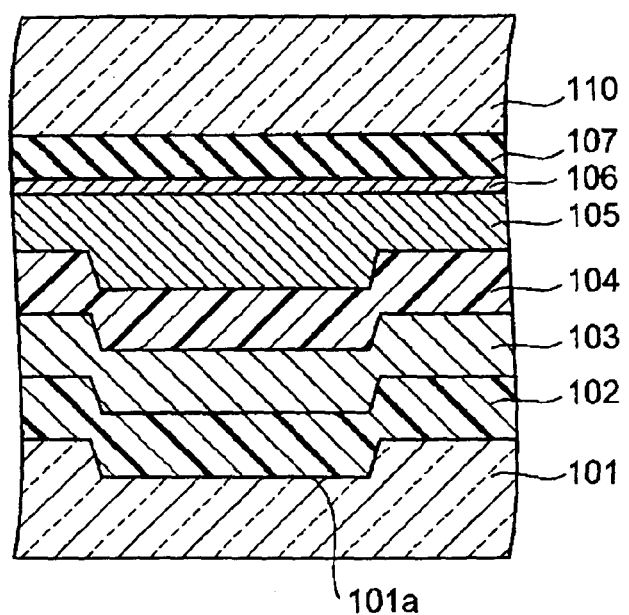
FIG. 11 is a schematic cross sectional view explaining the multilayer film structure of the optical disk.
Figure 12:
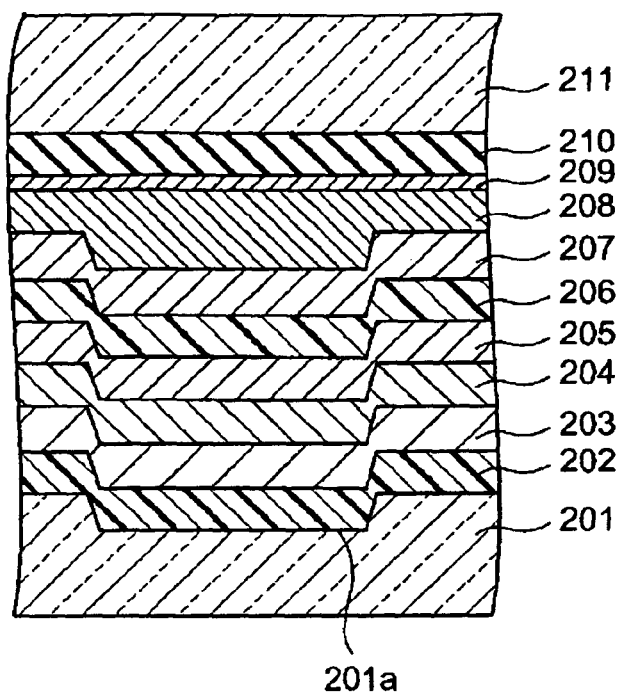
FIG. 12 is a schematic cross sectional view explaining the multilayer film structure of the optical disk.
Figure 13:
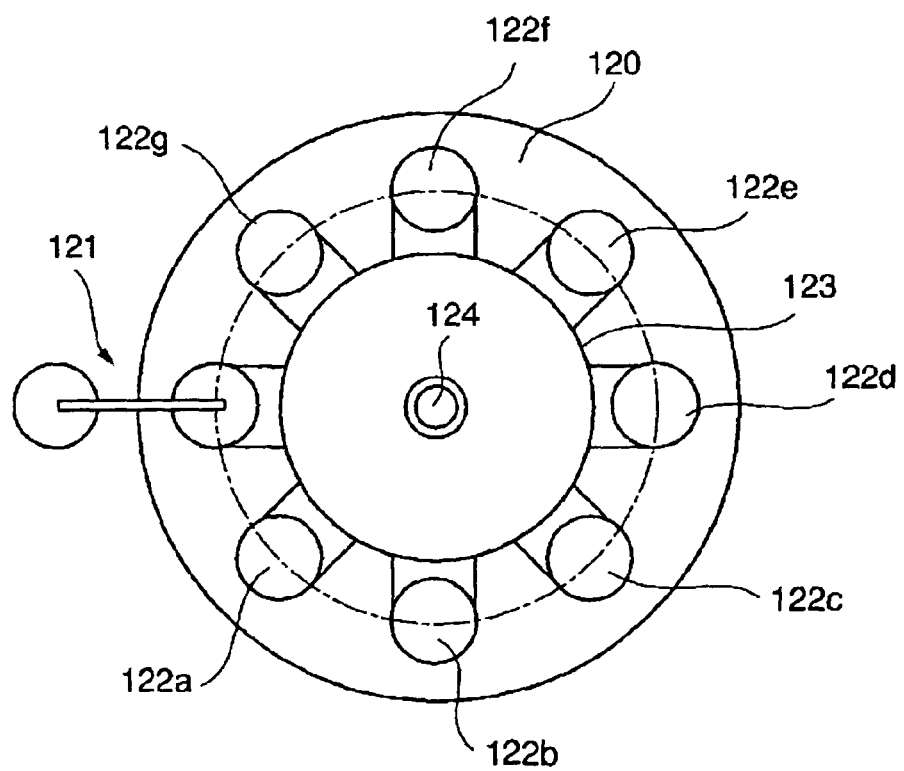
FIG. 13 is a schematic plan view of a conventional device.

1: Main chamber
10: First film-depositing process part
11: First chamber
12 (12*a*, 12*b*, 12*c*, 12*d*): First film-depositing chamber
13: Cooling chamber
14: Load lock mechanism
14*a*: Load lock chamber
15: First rotary carrying table
16: Susceptor
16*a*: Susceptor base
16*b*: Holder
17: Pusher
17*a*: Pusher piston
20: Second film-depositing process part
21: Second chamber
22 (22*a*, 22*b*, 22*c*, 22*d*): Second film-depositing chamber
23 (23*a*, 23*b*, 23*c*): Cooling chamber
25: Second rotary carrying table
30: Connecting part
31: First delivering position
32: Second delivering position
34: Delivering mechanism
35: Rotating shaft
36: Pick-and-place-arm
37 (37A, 37B): Electromagnetic chuck
50: Substrate
51: Center mask
52: Outer mask
60: Operation control part

What is claimed is:

1. A vacuum processing device, comprising:
a body with a plurality of adjacent processing spaces in a single vacuum chamber, wherein a first processing space includes a plurality of processing chambers radially arranged along a first circle, and a second processing space includes a plurality of processing chambers radially arranged along a second circle;
a first rotary carrying table having a plurality of susceptors configured to carry a processed object respectively, aligned with respective processing chambers of the first processing space, and a center of rotation aligned with a center of the first circle;
a second rotary carrying table having a plurality of susceptors aligned with respective processing chambers of the second processing space, and a center of rotation aligned with a center of the second circle;
a solid pick-and-place arm having a central axis of rotation and first and second chucks on first and second ends of the arm, respectively, wherein the arm solidly maintains an angular relationship between the first and second ends as the arm rotates about the central axis, wherein the chucks trace a third circle upon rotation of the pick-and-place arm, and wherein the third circle intersects both the first and second circles; and
a first delivery position having a first pusher lifting the susceptor with the processed object arranged on a position intersecting with the first circle and the third circle, and a second delivery position having a second pusher lifting the susceptor with the processed object arranged on a position intersecting with the second circle and the third circle;

wherein the pick-and-place arm simultaneously replaces respective susceptors with processed objects lifted by the first pusher on the first delivery position and by the second pusher on the second delivery position.

2. The vacuum processing device as set forth in claim 1, wherein the number of the first processing space's processing chambers is different from the number of the second processing space's processing chambers.

3. The vacuum processing device as set forth in claim 1, wherein the first processing space and the second processing space are provided with a cooling chamber configured to cool a processed object between respective processing chambers.

4. The vacuum processing device as set forth in claim 1, further comprising a connecting part between the first and second processing spaces, wherein the connecting part comprises delivering positions configured to deliver a processed object to the first processing space and the second processing space, and at least one of the delivering positions doubles as a cooling chamber.

5. The vacuum processing device as set forth in claim 1, wherein a third processing space is connected with at least one of the first processing space and the second processing space, and the third processing space comprises a third chamber being evacuated in a vacuum state, a third rotary carrying table disposed in the third chamber and forming a carrying route for a processed object, and a third film-depositing chamber disposed along a circumference centered at a rotating shaft of the rotary carrying table in the third chamber and depositing a film on the processed object to be carried by the rotary carrying table.

6. The device of claim 1, wherein the plurality of processing chambers of the first processing space include film-depositing chambers and cooling chambers arranged in an alternating pattern around the first circle.

7. The device of claim 1, further comprising a load lock arm positioned adjacent to the first rotary carrying table, and configured to move a processed object into and out of a processing chamber of the first processing space, while maintaining vacuum in the single vacuum chamber.

8. The device of claim 1, wherein the pick-and-place arm has three arms; wherein a first of the arms extends towards the first delivery position, a second of the arms extends towards the second delivery position, and a third of the arms extends towards a load lock chamber with a third pusher, wherein the pick-and-place arm simultaneously replaces respective processed objects lifted by respective pushers.

9. The device of claim 8, wherein the three arms are disposed at an angular interval of 120 degrees.

10. The device of claim 8, wherein the pick-and-place arm is configured to rotate and simultaneously exchange parts between the first rotary carrying table, the second rotary carrying table, and a load lock chamber.

11. The vacuum processing device as set forth in claim 1, wherein the first and second processing spaces are configured to perform a sequence of processing steps when connected together, or to perform identical processing in parallel by the first and second processing spaces in compliance with the number of the processing chambers.

* * * * *

UNITED STATES PATENT AND TRADEMARK OFFICE
CERTIFICATE OF CORRECTION

PATENT NO.       : 8,506,774 B2                              Page 1 of 1
APPLICATION NO.  : 11/596872
DATED            : August 13, 2013
INVENTOR(S)      : Ikeda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 781 days.

Signed and Sealed this
Fifteenth Day of September, 2015

Michelle K. Lee
*Director of the United States Patent and Trademark Office*